(12) United States Patent
Ko et al.

(10) Patent No.: US 7,355,262 B2
(45) Date of Patent: Apr. 8, 2008

(54) DIFFUSION TOPOGRAPHY ENGINEERING FOR HIGH PERFORMANCE CMOS FABRICATION

(75) Inventors: Chih-Hsin Ko, Fongshan (TW); Wen-Chin Lee, Hsin-Chu (TW); Chung-Hu Ke, Taipei (TW); Hung-Wei Chen, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 47 days.

(21) Appl. No.: 11/378,907

(22) Filed: Mar. 17, 2006

(65) Prior Publication Data

US 2007/0215936 A1 Sep. 20, 2007

(51) Int. Cl.
*H01L 29/00* (2006.01)
*H01L 29/76* (2006.01)
*H01L 29/94* (2006.01)
*H01L 31/062* (2006.01)
*H01L 31/113* (2006.01)

(52) U.S. Cl. ............... 257/506; 257/374; 257/501; 257/510; 257/524; 438/300

(58) Field of Classification Search ............. 438/300; 257/374, 501, 506, 510, 524
See application file for complete search history.

(56) References Cited

U.S. PATENT DOCUMENTS

| 5,248,893 A * | 9/1993 | Sakamoto ................ 257/409 |
|---|---|---|
| 5,883,396 A * | 3/1999 | Reedy et al. ................ 257/9 |
| 6,160,287 A * | 12/2000 | Chang .................... 257/321 |
| 6,251,751 B1 | 6/2001 | Chu et al. |
| 6,281,532 B1 | 8/2001 | Doyle et al. |
| 6,342,421 B1 * | 1/2002 | Mitani et al. ............ 438/300 |
| 6,570,217 B1 | 5/2003 | Sato et al. |
| 6,573,172 B1 | 6/2003 | En et al. |
| 6,683,364 B2 | 1/2004 | Oh et al. |
| 6,690,062 B2 * | 2/2004 | Henninger et al. ....... 257/340 |
| 6,870,179 B2 | 3/2005 | Shaheed et al. |
| 2001/0045597 A1 * | 11/2001 | Nishinohara ............. 257/329 |
| 2004/0104405 A1 | 6/2004 | Huang et al. |
| 2006/0033144 A1 * | 2/2006 | Forbes et al. ............ 257/315 |
| 2006/0091482 A1 * | 5/2006 | Kim et al. ............... 257/401 |

OTHER PUBLICATIONS

Yang, F.-L., et al., "5nm-Gate Nanowire FinFET," 2004 Symposium on VLSI Technology Digest of Technical Papers, IEEE, pp. 196-197.
Sato, T., et al., "Trench Transformation Technology Using Hydrogen Annealing for Realizing Highly Reliable Device Structure with Thin Dielectric Films," 1998 Symposium on VLSI Technology Digest of Technical Papers, IEEE, pp. 206-207.

(Continued)

*Primary Examiner*—Ida M. Soward
(74) *Attorney, Agent, or Firm*—Slater & Matsil, L.L.P.

(57) ABSTRACT

Semiconductor structures are formed using diffusion topography engineering (DTE). A preferred method includes providing a semiconductor substrate, forming trench isolation regions that define a diffusion region, performing a DTE in a hydrogen-containing ambient on the semiconductor substrate, and forming a MOS device in the diffusion region. The DTE causes silicon migration, forming a rounded or a T-shaped surface of the diffusion regions. The method may further include recessing a portion of the diffusion region before performing the DTE. The diffusion region has a slanted surface after performing the DTE.

16 Claims, 7 Drawing Sheets

OTHER PUBLICATIONS

Matsuda, S., et al., "Novel Corner Rounding Process for Shallow Trench Isolation Utilizing MSTS (Micro-Structure Transformation of Silicon)," IEDM, 1998, pp. 137-140.

Yang, H.S., et al., "Dual Stress Liner for High Performance sub-45nm Gate Length SOI CMOS Manufacturing," IEDM, 2004, pp. 1075-1077.

Ge, C.-H., et al., "Process-Strained Si (PSS) CMOS Technology Featuring 3D Strain Engineering," IEDM, 2003, pp. 73-76.

Sato, T., et al., "Micro-Structure Transformation of Silicon: A Newly Developed Transformation Technology for Patterning Silicon Surfaces Using the Surface Migration of Silicon Atoms by Hydrogen Annealing," Japanese Journal of Applied Physics, vol. 39, Part 1, No. 9A, Sep. 2000, pp. 5033-5038.

* cited by examiner

DIFFUSION TOPOGRAPHY ENGINEERING FOR HIGH PERFORMANCE CMOS FABRICATION

TECHNICAL FIELD

This invention relates generally to structure and fabrication methods of metal-oxide-semiconductor (MOS) devices, and more particularly to performance improvement of the MOS devices through diffusion topography engineering.

BACKGROUND

Profile control at the boundary of shallow trench isolation (STI) regions and diffusion regions (or source/drain regions) has been reported to drastically affect metal-oxide-semiconductor (MOS) device characteristics, such as junction capacitance, gate oxide leakage, sub-threshold leakage, junction leakage, etc. Diffusion regions with rounded corners have been proposed to alleviate some of the undesirable effects. With the shrinkage of the pitch size of the shallow trench isolation regions and diffusion regions, however, profile control has become more and more challenging.

Conventional MOS device fabrication methods suffer drawbacks. For example, STI formation processes typically create undesirable divots at the boundary of the STI regions and diffusion regions. The divots induce reverse narrow channel effects (RNCE) due to parasitic corner transistors and electrical field crowing at edges of the STI regions, leading to corner gate leakage, potential poly gate stringer and gate critical dimension control issues. Additionally, oxidation processes along sidewalls of the STI regions during the post-gapfill thermal cycle can also induce unfavorable compressive STI stress that significantly degrades device performance at small device widths.

Topology engineering, therefore, has come into practice. Recesses have been introduced into source/drain (S/D) regions for the engineering of diffusion region profiles. By combining high-stress contact etch stop layer (CESL) techniques with recessing of the S/D regions, more favorable stress can be induced and/or enhanced in channel regions of MOS devices, hence improving performance of the MOS devices.

Recessed source/drain regions combined with a stressed CESL may generate favorable strain effects in the channel regions, however, such recesses typically degrade the balance between source/drain resistance and junction depth, and induce potential source/drain-to-substrate leakage due to silicide punch-through.

There is the need, therefore, for a MOS device having improved performance without causing the previously discussed drawbacks.

SUMMARY OF THE INVENTION

The preferred embodiments of the present invention provide semiconductor devices having improved diffusion topography and methods for forming MOS devices using diffusion topography engineering (DTE).

In accordance with one aspect of the present invention, a semiconductor structure includes a substrate comprising a first diffusion region having a first substantially rounded surface and a second diffusion region having a second substantially rounded surface, a first metal-oxide-semiconductor (MOS) device on the first diffusion region, a second MOS device on the second diffusion region, a first stressed dielectric layer over the first MOS device and a second stressed dielectric layer on the second MOS device, wherein the first and the second stressed dielectric layers have substantially different stresses. Preferably, the first MOS device is an NMOS device, and the second MOS device is a PMOS device, wherein the first dielectric layer has an inherent tensile stress, and the second dielectric layer has an inherent compressive stress.

In accordance with another aspect of the present invention, a semiconductor structure includes a substrate comprising a first diffusion region, a first trench isolation region adjacent the first diffusion region and extending from a top surface of the substrate into the substrate, wherein the first diffusion region has a portion extending beyond an edge of the first trench isolation region and on a portion of the first trench isolation region, a first MOS device over the first diffusion region and a second stressed layer over the first MOS device. The semiconductor structure may include a second diffusion region having a second MOS device thereon.

In accordance with yet another aspect of the present invention, the semiconductor structure includes a first diffusion region, a first trench isolation region adjacent the first diffusion region and extending from a top surface of the substrate into the substrate, wherein the first diffusion region is slanted with a first portion close to a gate spacer substantially higher than a second portion close to a respective trench isolation region. The semiconductor structure further includes a first MOS device over the second diffusion region and a first stressed layer over the first MOS device. The semiconductor structure may include a second slant diffusion region having a second MOS device thereon.

A method of forming the preferred embodiments of the present invention is provided, which includes providing a semiconductor substrate, forming trench isolation regions extending from a top surface of the semiconductor substrate into the semiconductor substrate wherein the trench isolation regions define a diffusion region, performing a DTE in a hydrogen-containing ambient on the semiconductor substrate, forming a gate dielectric over the substrate, forming a gate electrode on the gate dielectric, forming a gate spacer on a sidewall of the gate electrode, forming a source/drain region substantially proximate a sidewall of the gate spacer, and forming a stress film over the gate electrode, the gate spacer and the source/drain region. The gate spacer could be a composite dielectric having a thickness between about 20 Å and about 700 Å depending on the desired device performance. The spacer may be removed after source/drain formation so that greater stress may be applied by the stressed dielectric layer.

In accordance with one aspect of the present invention, a rounded surface of the diffusion region is formed. In accordance with another aspect of the present invention, a T-shaped surface of the diffusion region is formed. In accordance with yet another aspect of the present invention, a slant surface of the diffusion region is formed by pre-etching exposed diffusion regions before performing the DTE. The shapes of the diffusion regions are partially determined by the pressure of the gas chamber in which the DTE is performed, and the temperature and duration of the DTE.

The DTE modifies the topography of the diffusion regions, thereby improving the stress in the respective MOS device. As a result, device performance is improved.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

According to silicon migration theory, hydrogen annealing can reduce the number of dangling bonds of silicon, resulting in migration of surface atoms so as to form a surface with a low surface energy, a reduced surface area and a low stress level. Diffusion topography engineering (DTE), as will be subsequently discussed in the preferred embodiments of the present invention, therefore, can be performed to create favorable topographies for the metal-oxide-semiconductor (MOS) devices. This in turn improves the stress in the channel regions of MOS devices, particularly the stress applied by stressed dielectric layers, and improves performance of MOS devices.

Figure 1:
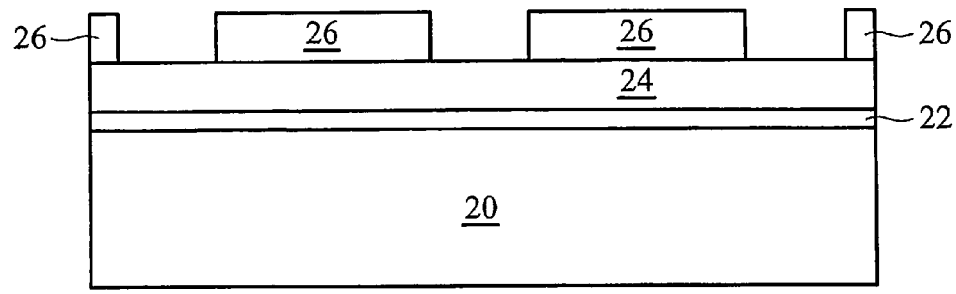
FIGS. 1 through 7 are cross-sectional views of intermediate stages in the manufacture of a preferred embodiment, wherein the diffusion regions form rounded surfaces due to DTE.

FIGS. 1 through 10 illustrate the preferred embodiments of the present invention featuring diffusion topography engineering. Throughout the various views and illustrative embodiments of the present invention, like reference numbers are used to designate like elements. Referring to FIG. 1, a substrate 20 and a starting structure for the formation of shallow trench isolation regions are shown. In the preferred embodiment, the substrate 20 is a bulk silicon substrate. In alternative embodiments, the substrate 20 comprises silicon, germanium, carbon, or combinations thereof. The substrate 20 may have a silicon-on-insulator structure.

A pad layer 22 and a hard mask layer 24 are formed on the substrate 20. The pad layer 22 is preferably a thin film formed through a thermal process. In the preferred embodiment, the hard mask layer 24 is formed of silicon nitride using low-pressure chemical vapor deposition (LPCVD). In other embodiments, the hard mask layer 24 can be formed by thermal nitridation or plasma anodic nitridation of silicon using nitrogen-hydrogen. Photo resist 26 is then formed and patterned. A dielectric anti-reflection coating (ARC) layer (not shown) may be interposed between the hard mask layer 24 and the photo resist 26. The dielectric ARC layer includes organic dielectric or inorganic dielectric such as silicon oxynitride or silicon oxide formed by plasma enhanced CVD.

Figure 2:
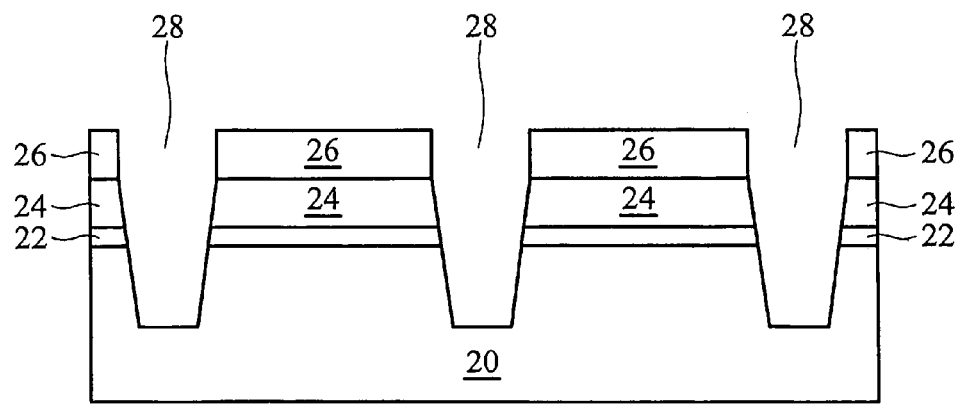
Figure 3:
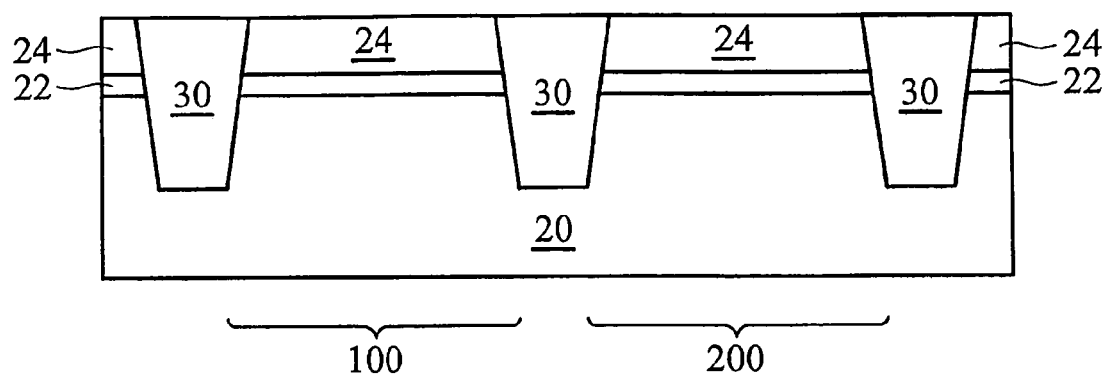

Trenches 28 are anisotropically formed, as shown in FIG. 2, preferably by anisotropic plasma etching using fluorine-containing chemicals. The photo resist 26 is then removed. In the preferred embodiment, the trenches 28 are filled with a dielectric material, preferably silicon oxide formed by high-density plasma (HDP). In other embodiments, a combination of trench-filling materials, such as a combination of CVD silicon oxide and CVD poly-silicon can be used. After filling the trenches 28, the filling material is preferably densified by either a pyrogenic oxidation annealing at a temperature of about 800° C. or a conventional annealing in an argon-containing ambient at about 1000° C. A chemical mechanical polishing step is then performed to planarize the surface of the wafer, forming shallow trench isolation (STI) regions 30, and the resulting structure is shown in FIG. 3. The STI regions 30 define a first diffusion region (sometimes referred to as an active region) 100 and a second diffusion region 200. Preferably, the diffusion regions 100 and 200 are lightly doped with impurities, and the types of impurities depend on the type of MOS device subsequently formed thereon. In the preferred embodiment, the diffusion region 100 is doped with a P-type impurity and the diffusion region 200 is doped with an N-type impurity.

Figure 4:
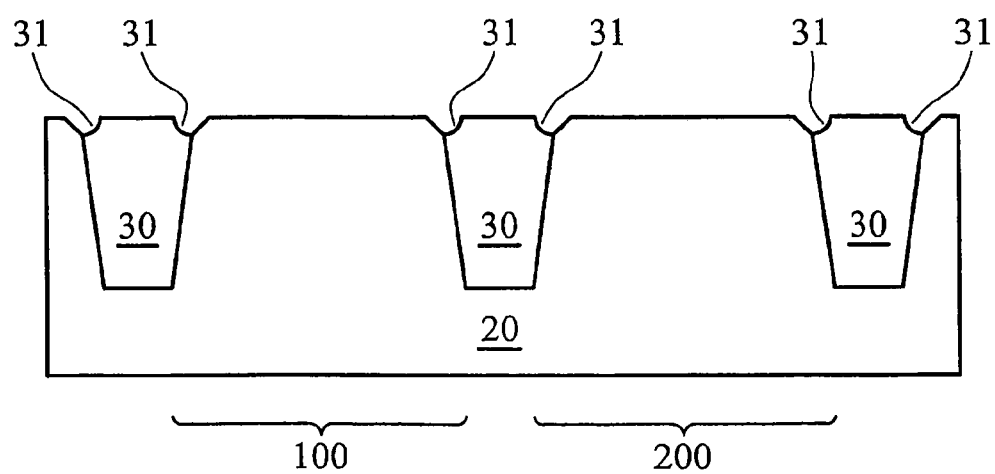

FIG. 4 illustrates the removal of pad layer 22 and hard mask layer 24. Preferably, hard mask layer 24 is removed by etching in phosphoric acid, preferably at an elevated temperature of between about 50° C. and about 200° C. Pad layer 22 is preferably stripped using diluted hydrofluoric acid. Note that the etch steps result in the formation of divots 31 at the borders of the diffusion regions/STIs.

A DTE is then performed. In the preferred embodiment, the DTE is performed by annealing in a hydrogen-containing ambient. The ambient preferably contains other gases such as nitrogen, helium, neon, argon, xenon, and combinations thereof. The preferred gas pressure is between about 1 Torr and 1000 Torr, and more preferably between about 1 Torr and about 300 Torr. Preferably, the DTE is performed at temperature of between about 700° C. and 1200° C., and more preferably between about 900° C. and about 1100° C., for between about 5 and about 120 seconds.

Figure 5:
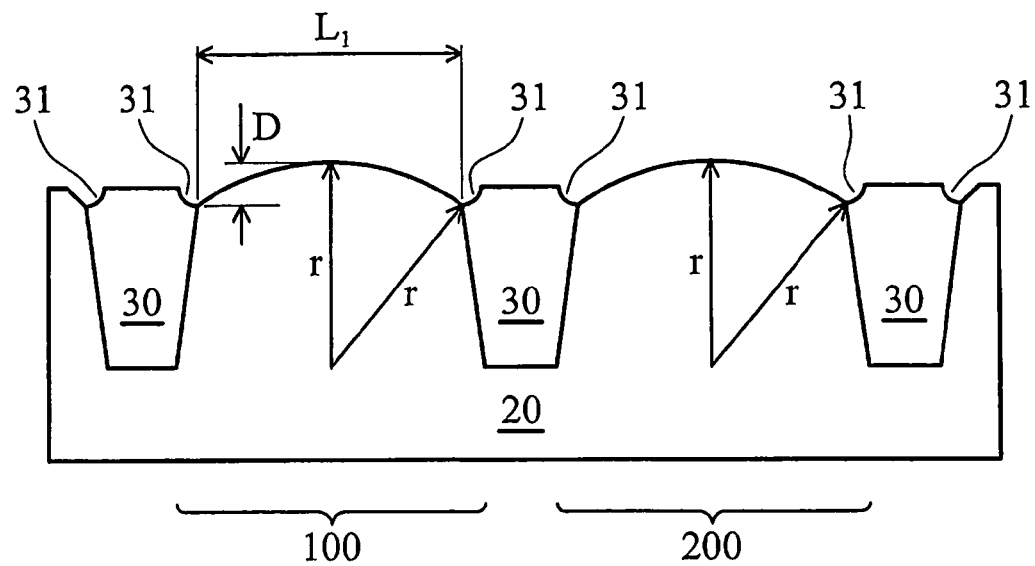

Due to the DTE, the silicon atoms migrate, so that the surfaces in the regions 100 and 200 become rounded, as illustrated in FIG. 5. The temperature, pressure and anneal duration affect the profiles of the surfaces in regions 100 and 200. The roundness of diffusion regions 100 and 200 is affected by various factors, such as the material and the length $L_1$ of the diffusion regions 100 and 200, so that different temperatures, pressures and anneal durations may be required. One skilled in the art can find suitable temperatures, pressures and anneal durations through routine experiments.

The curvatures of the surface of the substrate 20 are preferred features since they help reduce stress caused at the corners of the STI regions 30. The curvatures can be defined by a radius r, which is a normalized value and is preferably less than about 1 μm. The radius r is related to the length $L_1$ of the diffusion regions 100 and 200, and is preferably greater than about 0.5 μm when the length $L_1$ of the diffusion regions 100 and 200, respectively, is less than about 10 μm. Also, the highest point, which is substantially close to the center point of the diffusion region 100 or 200, is higher than the lowest point, which is substantially close to the STI region 30, by a height difference D, and the height difference D and the length L preferably has a ratio of greater than about 1/50, more preferably between about 1/2 and 1/10. The surfaces of diffusion regions 100 and 200 preferably have substantially the same curvature.

On a chip, an optimum radius r is related to the active region density, which is a ratio of the total area of active regions in a given region and the total area of the given region. Preferably, with an active region density of greater than about 35%, the desired radius r is preferably less than about 3 µm. If the average active region density is between about 15% and about 35%, the radius r is preferably less than about 2 µm. If the active region density is less than about 15%, the radius r is preferably less than about 1 µm.

Figure 6:
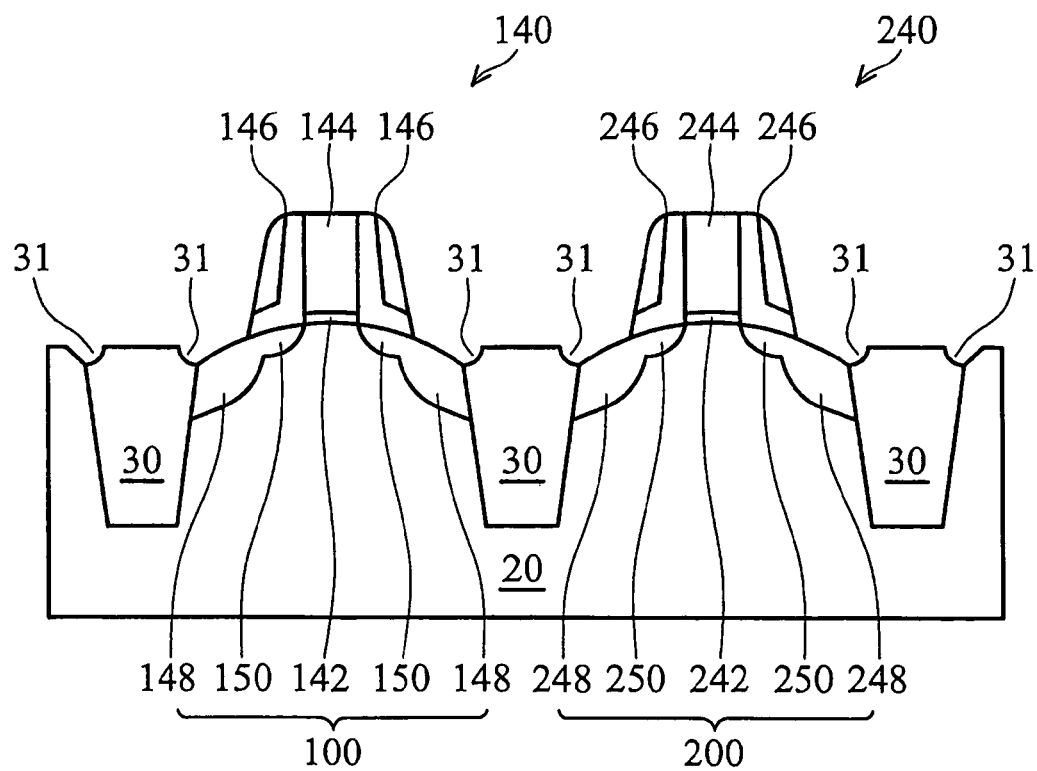

MOS devices are then formed on the substrate 20, as shown in FIG. 6. In the preferred embodiment, an NMOS device 140 is formed in diffusion region 100, and a PMOS device 240 is formed in diffusion region 200.

As is well known in the art, to form gate dielectrics 142 and 242 and gate electrodes 144 and 244, a gate dielectric layer is deposited followed by a gate electrode layer deposition. The gate dielectric layer may comprise silicon oxide, silicon oxynitride, silicon nitride, aluminum oxide, lanthanum oxide, hafnium oxide, zirconium oxide, hafnium oxynitride, and combinations thereof. The gate electrode layer preferably comprises a conductive material, such as metal, metal silicide, metal nitride, doped poly-crystalline silicon, or other conductive materials. A lithography step is then performed followed by an etching step to form respective gate dielectrics 142 and 242 and gate electrodes 144 and 244 in diffusion regions 100 and 200. Source/drain extension regions 150 and 250 are then formed, preferably by impurity implantations.

Next, spacers 146 and 246 are formed on the sides of the respective gate electrodes 144 and 244. The spacers 146 and 246 may be formed by chemical vapor deposition of a dielectric material followed by anisotropic etching of the dielectric material to form simple spacers. The spacers 146 and 246 may also be composite spacers comprising a dielectric liner and a spacer body, and the thickness is preferably between about 20 Å and about 700 Å depending on the desired device performance. The spacers 146 and 246 may be removed after source/drain formation so that greater stress may be applied by the stressed dielectric layer. The source/drain regions 148 and 248 are then formed, preferably by implanting appropriate impurities.

Figure 7:
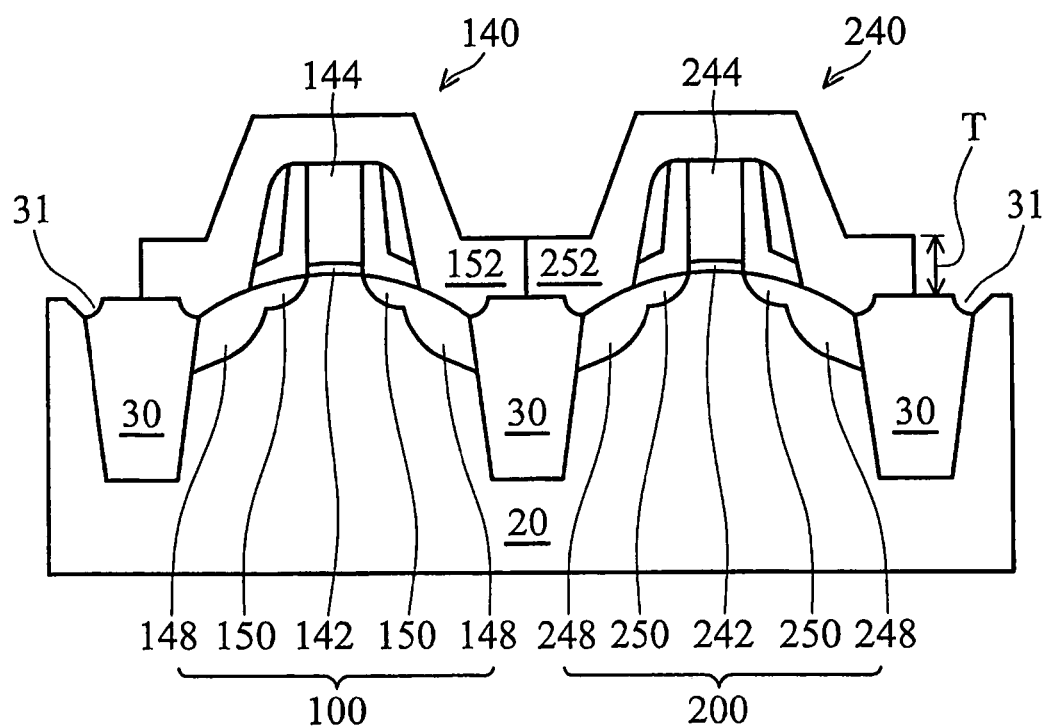

FIG. 7 illustrates the formation of a dual high-stress film, which comprises a stressed dielectric layer 152 in region 100 and a stressed dielectric layer 252 in region 200. The stressed dielectric layers 152 and 252 may be contact etch stop layers (CESL) or additionally formed dielectric layers. In the preferred embodiment, the stressed dielectric layers provide high stresses and may be formed of silicon nitride, silicon oxynitride, and the like. Preferably, the stressed dielectric layer 152 has an inherent tensile stress, and the stressed dielectric layer 252 has an inherent compressive stress. The stressed dielectric layers 152 and 252 preferably have high stresses in a range of 0.1 to 3 giga-pascals (GPa). The tensile-stressed dielectric layer 152 results in a tensile stress in the channel region of the NMOS device 140, enhancing the electron mobility, while the compressive-stressed dielectric layer 252 results in a compressive stress in the channel region of the PMOS device 240, enhancing the hole mobility, and thus performance of the NMOS device 140 and PMOS device 240 are both improved. In the preferred embodiment, the stressed layers 152 and 252 comprise a same material, such as silicon nitride or silicon oxynitride, but are formed with different deposition parameters, thus different stress types are generated. In alternative embodiments, different materials are used. Preferably, the stressed dielectric layers 152 and 252 are formed using a chemical vapor deposition (CVD) process, such as a low-pressure CVD (LPCVD) process or a plasma-enhanced CVD (PECVD) process, as is commonly known and used in the art.

The stressed dielectric layers 152 and 252 preferably have a thickness of between about 250 Å and about 1500 Å, and more preferable between about 250 Å and about 850 Å. Also the optimum thickness of the stressed dielectric layers 152 and 252 are preferably between about 250 Å and about 1000 Å when the length $L_1$ of the diffusion regions 100 and 200 is less than about 10 µm. The thickness difference between the stressed dielectric layers 152 and 252 is preferably between about 25 Å and about 250 Å, and top surfaces of the stressed dielectric layers 152 and 252 preferably have a step difference of greater than about 10 Å. The optimized thickness T of the stressed dielectric layers 152 and 252 is also related to the active region density also. Therefore, the thickness T is preferably selected based on the active region density. Preferably, if the active region density is greater than about 35%, the thickness T is preferably less than about 900 nm. If the active region density is between about 15% and about 35%, the thickness T is preferably less than about 1 µm. If the active region density is less than about 15%, the thickness T is preferably less than about 100 nm.

Figure 8:
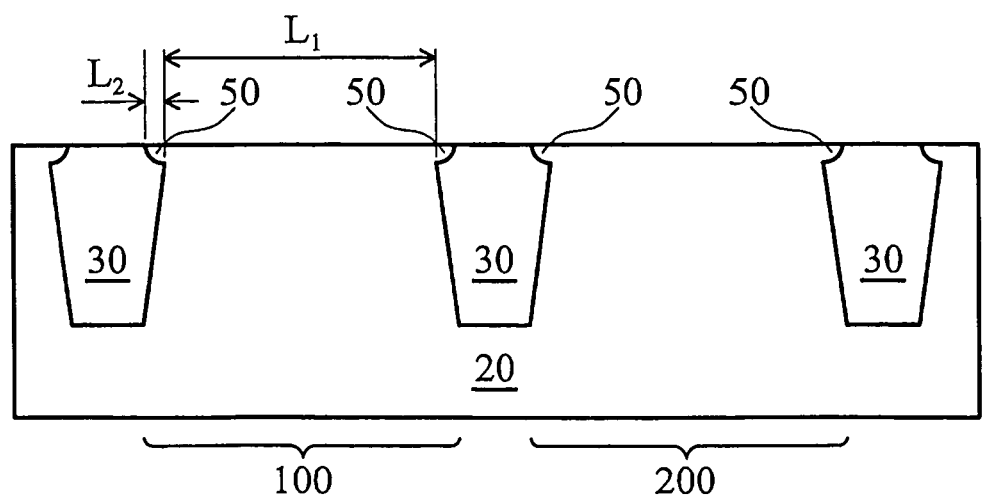
FIGS. 8 and 9 are cross-sectional views of intermediate stages in the manufacture of a preferred embodiment, wherein the diffusion regions form T-shaped surfaces due to DTE.
Figure 9:
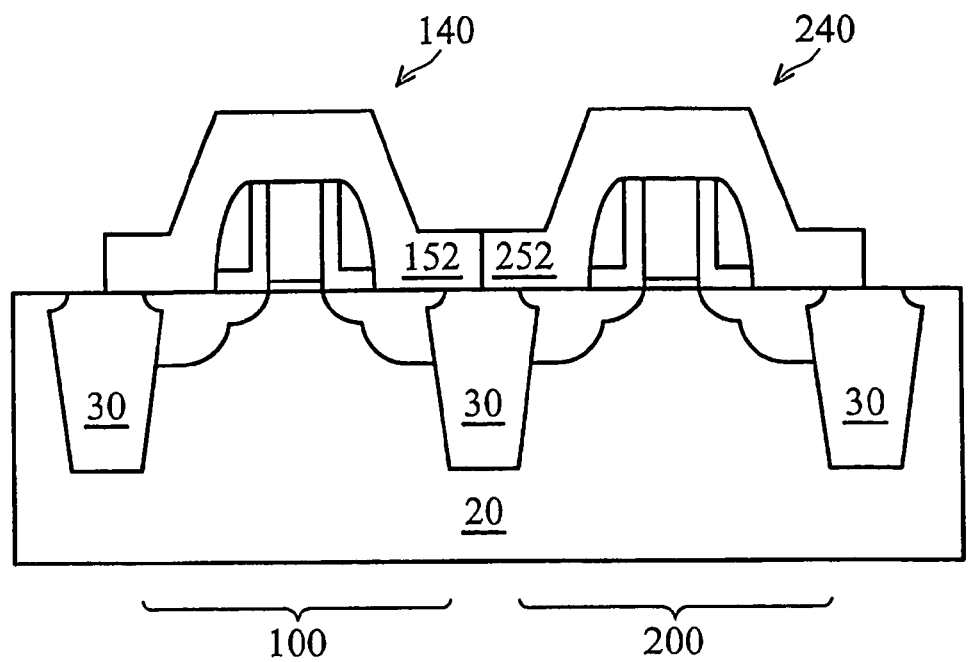

Another preferred embodiment of the present invention is illustrated in FIGS. 8 and 9. The initial stages are similar to that shown in FIGS. 1 through 4. In the preferred embodiment, the DTE is performed by an annealing in a hydrogen-containing ambient, and the ambient preferably has gases such as nitrogen, helium, neon, argon, xenon, and combinations thereof. The preferred gas pressure is between about 1 Torr and 1000 Torr, and more preferably between about 1 Torr and about 100 Torr. Preferably, the DTE is performed at a temperature of between about 700° C. and 1200° C., and more preferably between about 1000° C. and about 1200° C., for between about 10 and about 200 seconds.

The DTE causes extensions 50 to be formed in the STI divots 31 (refer to FIG. 4), and T-shaped diffusion areas are formed. Stresses in the channel regions are improved due to the improved stress at the corners of the STI regions 30. The preferred DTE parameters in this embodiment are similar to that in the previously discussed embodiment. However, a higher temperature, a lower pressure, and/or a longer annealing time will facilitate more silicon migration to form diffusion regions have T-shaped surfaces, and a lower temperature, a higher pressure, and/or a shorter annealing time will cause rounded diffusion regions to be formed. Therefore, by adjusting the temperature, pressure and duration, either rounded or T-shape diffusion surface areas can be obtained. For example, the following table shows exemplary DTE parameter sets and resulting diffusion region surfaces.

TABLE 1

|  | Temperature (° C.) | Pressure (Torr) | Duration | Surface |
| --- | --- | --- | --- | --- |
| Parameters set 1 | 950 | 1 | 40 seconds | rounded |
| Parameters set 2 | 950 | 10 | 2 minutes | rounded |
| Parameters set 3 | 1000 | 1 | 10 seconds | rounded |
| Parameters set 4 | 1000 | 1 | 40 seconds | T-shaped |
| Parameters set 5 | 1000 | 10 | 2 minutes | T-shaped |

It is to be understood that the parameters for forming rounded or T-shaped diffusion regions are affected by various factors, such as the materials and dimensions of the diffusion regions, and the above listed DTE parameters are only examples. One skilled in the art will be able to find suitable parameters for forming rounded or T-shape diffusion areas through experimentation.

In the preferred embodiment, recesses in which extensions 50 are formed are naturally formed by the trench formation processes. In alternative embodiments, however, corners of the STI regions 30 can be etched to further shape the extensions 50.

The length $L_2$ of the extensions 50 is also preferably determined based on the density of the active regions. If the active region density is greater than about 35%, the length $L_2$ is preferably less than about 650 Å. If the active region density is between about 15% and about 35%, the length $L_2$ is preferably less than about 550 Å. If the active region density is less than about 15%, the length $L_2$ is preferably less than about 450 Å. The length $L_2$ and the length $L_1$ of the diffusion regions 100 and 200 preferably have a ratio of between about 1/50 and about 3/5, and more preferably about 1/10 and 3/5. The top surfaces of the diffusion regions 100 and 200 are preferably leveled with the top surfaces of the STI regions 30.

As shown in FIG. 9, an NMOS device 140 and a PMOS device 240 are formed in regions 100 and 200, respectively. A dual high-stress film, which comprises films 152 and 252, is then formed covering respective MOS devices 140 and 240. The details of the stressed dielectric layers 152 and 252 have been discussed in the previous embodiment, and thus are not repeated herein.

Figure 10:
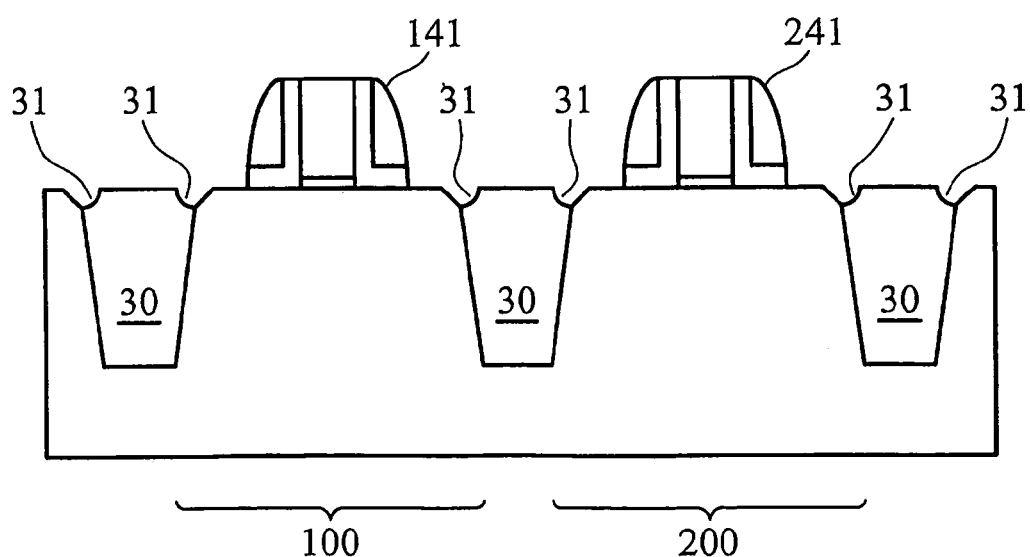
FIGS. 10 through 12 are cross-sectional views of intermediate stages in the manufacture of another preferred embodiment, wherein the diffusion regions form slant surfaces due to DTE.
Figure 11:
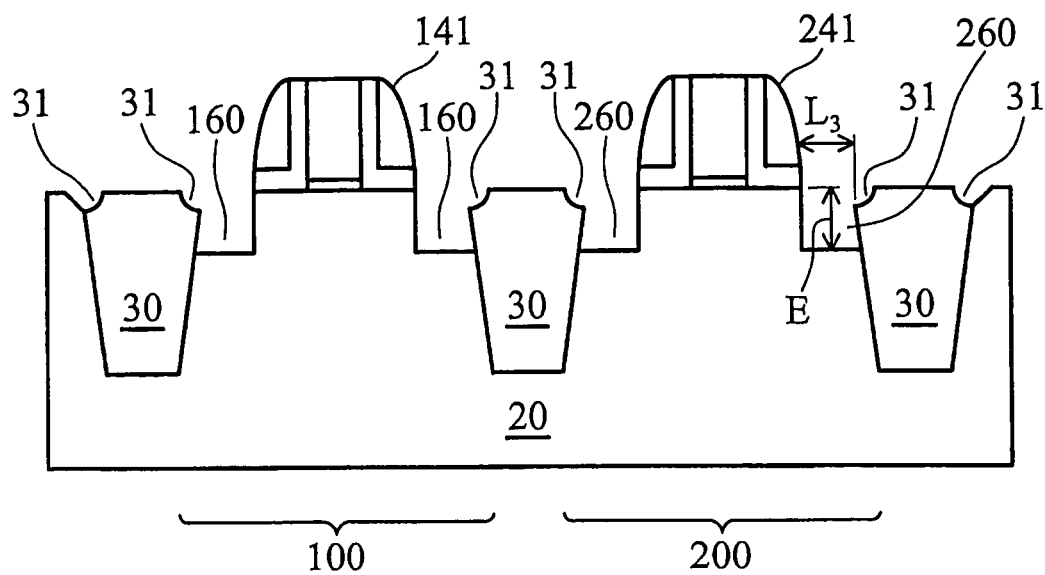
Figure 12:
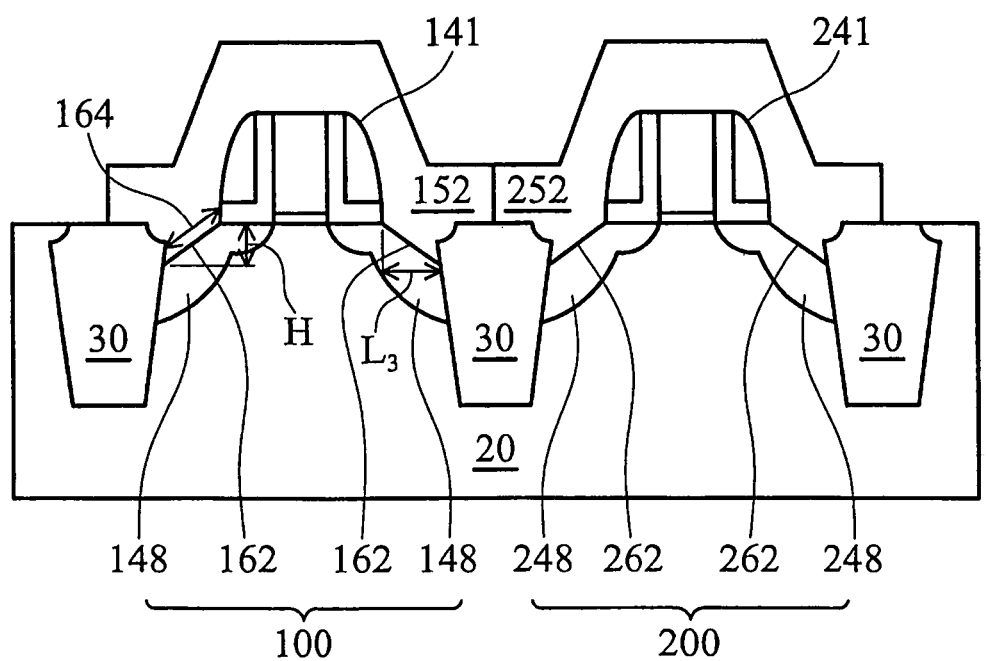

FIGS. 10 through 12 illustrate yet other embodiments of the present invention. The initial stages are similar to those shown in FIGS. 1 through 4. The gate structures 141 and 241 are then formed in regions 100 and 200, respectively, as shown in FIG. 10. Preferably, no DTE is performed before the formation of the gate structures 141 and 241, although one can be performed. Referring to FIG. 11, after the formation of gate spacers 146 and 246, recesses 160 and 260 are formed, preferably by a dry plasma etching process or other etching techniques, in the exposed diffusion regions 100 and 200, respectively. In the preferred embodiment wherein the substrate 20 comprises silicon, the plasma etching process may employ a fluorine-containing chemical. Preferably, the depth E and the width $L_3$ of the recesses 160 and 260 have a ratio of between about 3/500 and about 1/2, and more preferably between about 1/10 and 1/2.

Next, as shown in FIG. 12, a DTE process is performed. Due to silicon migration, slant surfaces 162 and 262 are formed in diffusion regions 100 and 200, respectively. The DTE parameters, such as temperature, pressure and duration, are similar to those in the previously discussed embodiments. By adjusting the DTE parameters, the surfaces 162 and 262 can be substantially flattened, although slanted. Preferably, the height difference H and the length $L_3$ of the respective slanted surfaces 162 and 262 have a ratio of between about 3/500 and about 1/2, and more preferably between about 1/10 and 1/2. Alternatively, the ratio is preferably between about 1/5 and 1/2.

After the DTE process, source/drain regions 148 and 248 and stressed dielectric layers 152 and 252 are formed, and the details of the formation have been discussed in previously discussed embodiments.

With slanted S/D surfaces, a stressed-CESL not only induces preferable stress in the lateral direction (channel direction) but also in the vertical direction. For example, a stressed dielectric layer 152 having a tensile stress 164 along the slant surface 162 induces a vertical compressive stress and a lateral tensile stress in the channel region. With a tensile-stressed dielectric layer, NMOS devices can achieve higher drive current with stresses in both directions.

Figure 13:
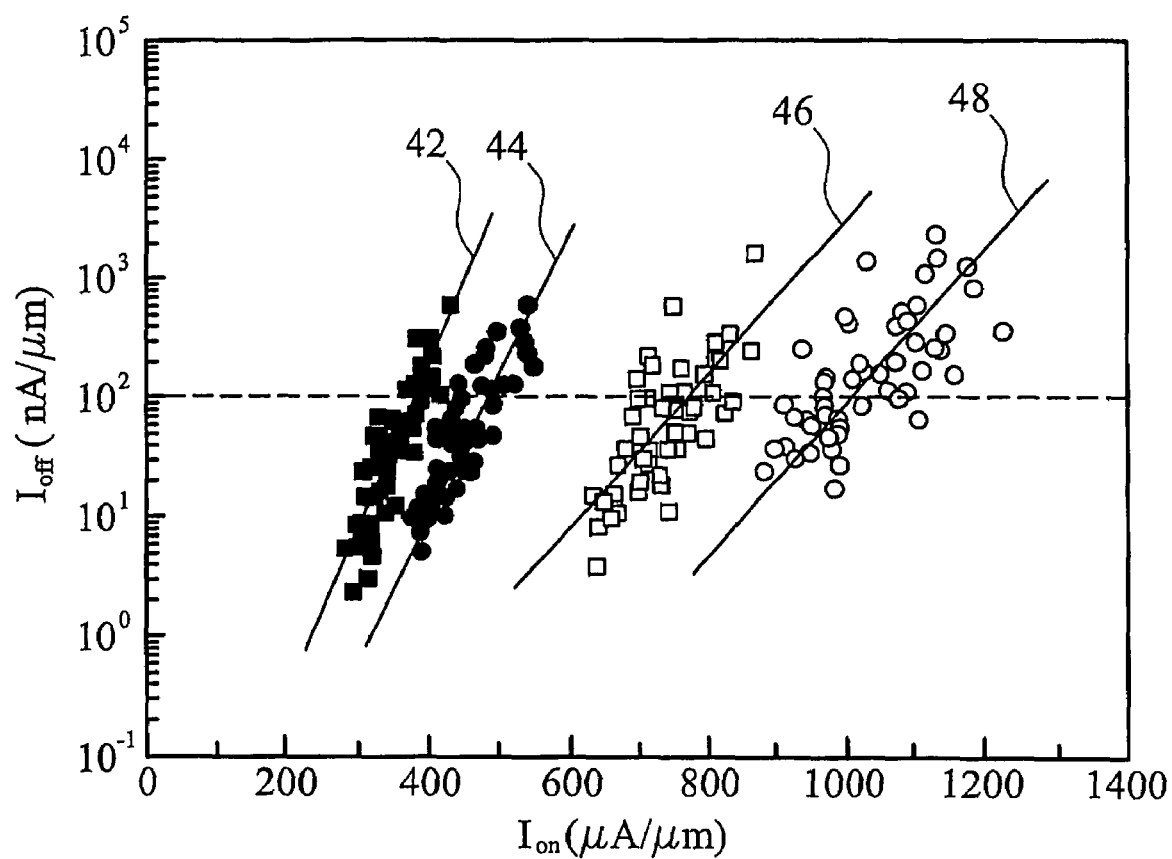
FIG. 13 illustrates the performance improvement of the preferred embodiments of the present invention, wherein leakage currents are depicted as a function of device drive currents.

FIG. 13 illustrates the performance improvement of the preferred embodiments of the present invention, wherein leakage currents ($I_{off}$) are shown as a function of device drive currents ($I_{on}$). Lines 42 and 44 are obtained from prior art PMOS devices and DTE engineered PMOS devices, respectively, and lines 46 and 48 are obtained from prior art NMOS devices and DTE engineered NMOS devices, respectively. It is found that for both NMOS and PMOS devices, at the same leakage current, the device drive currents of the preferred embodiments of the present invention have about 24 to about 27 percent improvement over conventional devices that are not engineered by DTE processes. Other experiment results (not shown) have also revealed that the delay time of the devices formed using DTE has about a 10 percent improvement over prior art devices.

The preferred embodiments of the present invention have improved stress in the MOS devices, particularly because the stress applied by the stressed dielectric layers is better utilized through engineered surfaces of the diffusion regions. Improved stress at the corners of the STI regions also aid the performance improvement. The preferred embodiments of the present invention have several advantageous features. Firstly, the preferred embodiments of the present invention can be easily integrated with dual-stress layer techniques to reap the benefits of strain superposition. Secondly, DTE causes the surface of the diffusion region to be smoother, improving the integrity of the gate dielectric formed thereon and the reliability of the MOS device. Thirdly, the silicide punch through problem, which is typically introduced due to the recessing of source/drain regions, is also reduced. Overall, DTE is a cost-effective technology for future CMOS enhancement with minimal development efforts.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor structure comprising:
   a substrate comprising a first diffusion region having a first substantially rounded surface and a second diffusion region having a second substantially rounded surface, wherein the first diffusion region has a center portion higher than an edge portion by a height difference of greater than about 1/50 of a length of the first diffusion region;
   a first metal-oxide-semiconductor (MOS) device on the first diffusion region;
   a second MOS device on the second diffusion region;
   a first stressed dielectric layer over the first MOS device; and a second stressed dielectric layer on the second MOS device, wherein the first and the second stressed dielectric layers have substantially different stresses.

2. The semiconductor structure of claim 1, wherein the first diffusion region has a first length, and wherein a radius of the first diffusion region is greater than about 0.5 µm when the first length is less than about 10 µm.

3. The semiconductor structure of claim 1 wherein the first diffusion region has a first top surface and the isolation region has a second top surface, and wherein the first top surface and the second top surface have a step difference of greater than about 10 Å.

4. The semiconductor structure of claim 1, wherein the center portion is higher than the edge portion by a height difference of greater than about 10 percent of a length of the diffusion region.

5. The semiconductor structure of claim 1, wherein the first stressed dielectric layer has a thickness of between about 250 Å and about 1500 Å.

6. The semiconductor structure of claim 1, wherein the first stressed dielectric layer and the second stressed dielectric layer have a thickness difference of between about 25 Å and about 250 Å.

7. The semiconductor structure of claim 1 wherein the first MOS device comprises a gate dielectric on the substrate, wherein a portion of the substrate directly underlying the gate dielectric has a rounded surface.

8. A semiconductor structure comprising:
a substrate comprising a diffusion region;
a trench isolation region adjacent the diffusion region and extending from a top surface of the substrate into the substrate, wherein the diffusion region has a portion extending beyond an edge of the trench isolation region and on a portion of the trench isolation region, and wherein a length of the extending portion and a length of the diffusion region have a ratio of greater than about 3/50;
a MOS device over the diffusion region; and
a stressed layer over the MOS device.

9. The semiconductor structure of claim 8, wherein the ratio is greater than about 1/10.

10. The semiconductor structure of claim 8, wherein a length of the extending portion is less than about 650 Å if a respective active region density is greater than about 35%.

11. The semiconductor structure of claim 8, wherein a length of the extending portion is less than about 550 Å if a respective active region density is between about 15% and about 35%.

12. The semiconductor structure of claim 8, wherein a length of the extending portion is less than about 450 Å if a respective active region density is less than about 15%.

13. The semiconductor structure of claim 8, wherein the stressed layer has a thickness of between about 250 Å and about 1500 Å.

14. A semiconductor structure comprising:
a substrate comprising a diffusion region;
a trench isolation region adjacent the diffusion region and extending from a top surface of the substrate into the substrate, wherein the diffusion region is slanted with a first portion close to a gate electrode substantially higher than a second portion close to a respective trench isolation region;
a MOS device over the diffusion region; and
a stressed layer over the MOS device.

15. The semiconductor structure of claim 14, wherein the first portion and the second portion have a height difference greater than about 0.6 percent of a distance between a side edge of the gate electrode and the trench isolation region.

16. The semiconductor structure of claim 15, wherein the height difference is greater than about 10 percent of the distance between the side edge of the gate electrode and the trench isolation region.

* * * * *